United States Patent [19]

Yamanishi et al.

[11] Patent Number: 4,845,535

[45] Date of Patent: Jul. 4, 1989

[54] LIGHT EMITTING SEMICONDUCTOR DEVICE

[75] Inventors: Masamichi Yamanishi, Hiroshima; Ikuo Suemune; Yasuo Kan, both of Higashihiroshima, all of Japan

[73] Assignee: Hiroshima University, Hiroshima, Japan

[21] Appl. No.: 147,553

[22] Filed: Jan. 19, 1988

[30] Foreign Application Priority Data

Jan. 23, 1987 [JP] Japan .................................. 62-12552

[51] Int. Cl.$^4$ .......................... H01S 3/19; H01L 33/00
[52] U.S. Cl. ........................................ 357/17; 372/45; 372/46; 357/16
[58] Field of Search ...................... 357/17, 16; 372/45, 372/46, 50

[56] References Cited

U.S. PATENT DOCUMENTS 4,475,200 10/1984 Lee ........................................ 357/17
4,503,540 3/1985 Nakashima et al. ................... 357/17

OTHER PUBLICATIONS

Henry Kressel and J. K. Butler, an article from "Semiconductor Lasers and Heterojunction LEDs", entitled: Relation Between Electrical and Optical Properties of Laser Diodes, Chapter 8, published by Academic Press, New York, San Francisco, London, 1977, pp. 249-261.
Henry Kressel and J. K. Butler, an article from "Semiconductor Lasers and Heterojunction LEDs", entitled: Transient Effects in Laser Diodes, Chapter 17, published by Academic Press, New York, San Francisco, London, 1977, pp. 555-579.
L. A. Glasser, E. P. Ippen, and H. A. Haus, "Picosecond Pulse Generation with a cw GaAlAs Laser Diode", Appl. Phys. Lett. 33(3), Aug. 1, 1978, pp. 241-242.

Primary Examiner—William L. Sikes
Assistant Examiner—Georgia Y. Epps
Attorney, Agent, or Firm—Spencer & Frank

[57] ABSTRACT

The disclosed light emitting semiconductor device has an n-type (or p-type) base region sandwiched by a p-type (or n-type) emitter region and a p-type (or n-type) collector region. An injecting voltage source is connected across the emittter region and base region so as to apply a constant voltage therebetween, while a control voltage source is connected across the emitter region and the collector region so as to selectively apply a reverse bias to a base-collector junction for controlling recombination of carriers injected to the base region. The control voltage source produces such non-emitting period voltage and emitting period voltage that carriers injected during the non-emitting period voltage are captured in the base region while the carriers thus captured are allowed to recombine during the emitting period voltage.

4 Claims, 3 Drawing Sheets

FIG_1A
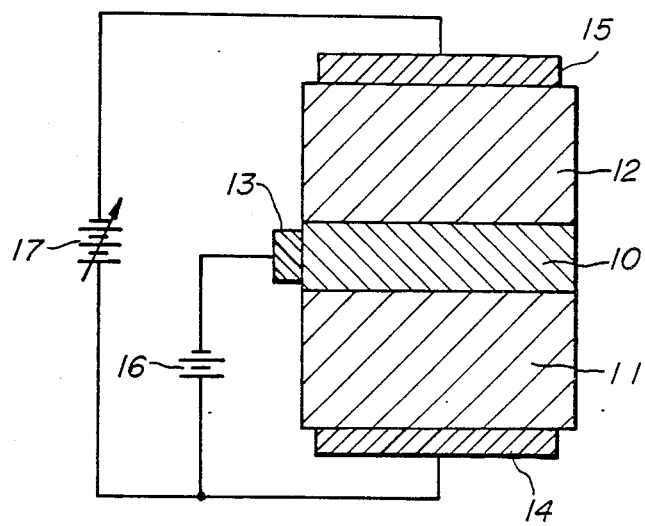
FIG_1B
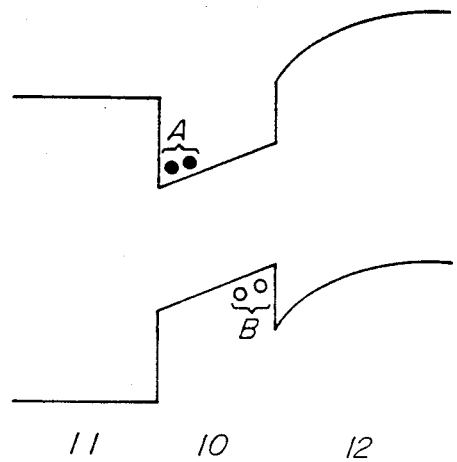

FIG_4
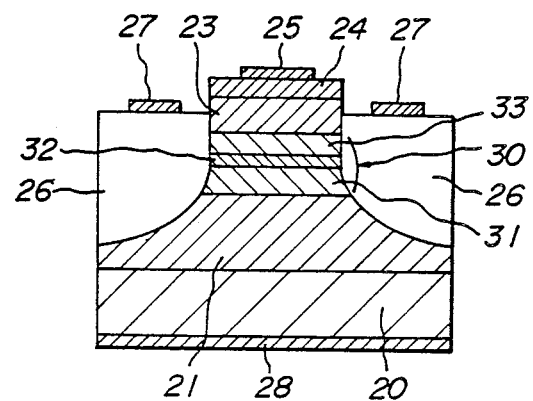
FIG_5
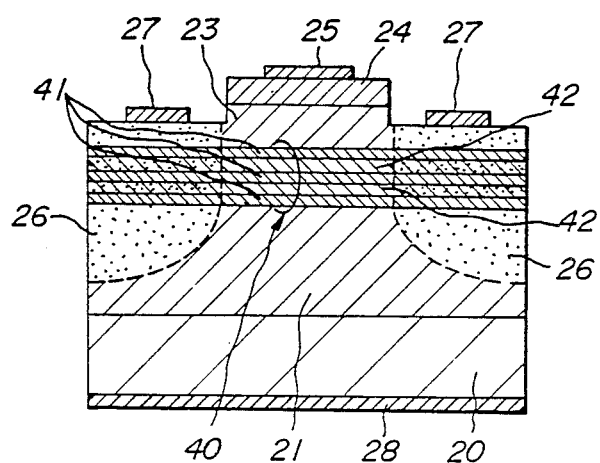

FIG_6 (PRIOR ART)
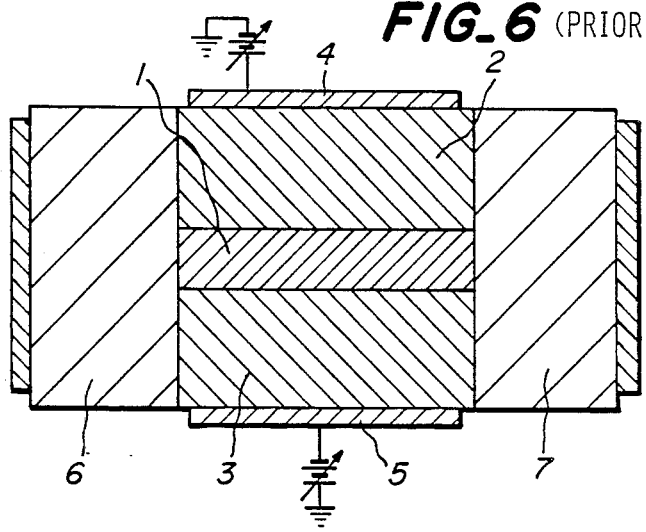
FIG_7A (PRIOR ART)
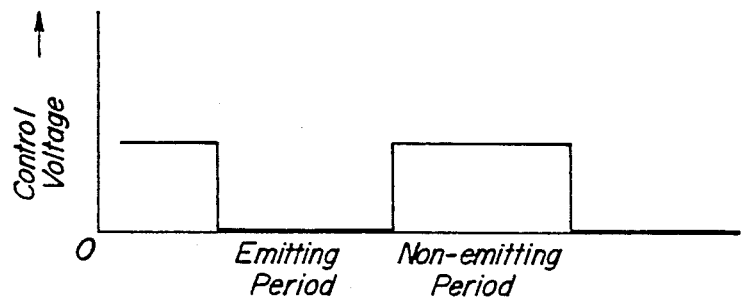
FIG_7B (PRIOR ART)
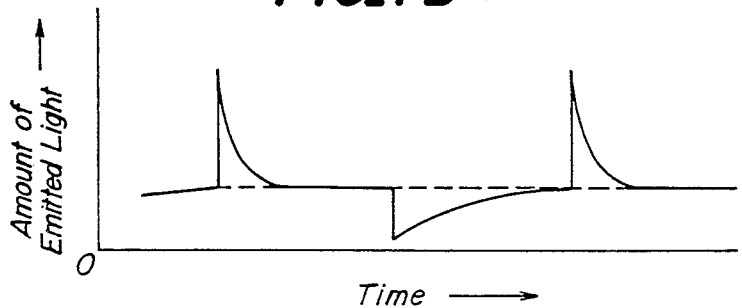

LIGHT EMITTING SEMICONDUCTOR DEVICE

BACKGROUND OF THE INVENTION

1. Field of the Invention

This invention relates to a light emitting semiconductor device, such as semiconductor laser device and a light emitting diode. More particularly, the invention relates to a light emitting semiconductor device which is suitable for high-speed modulation.

2. Related Art Statement

With the progress of communication technology, there is an increasing demand for the development of a light emitting semiconductor device whose output can be modulated at a high speed.

To modulate the radiated output from a light emitting semiconductor device, a direct modulation method has been widely used heretofore, which method modulates by applying a modulating signal to an injection current that is a source of light emission from the light emitting device. This direct modulation method controls the amount of light emission or amplification gain factor for light waves by regulating the number of electrons and holes in an active layer. With such control, the time necessary for switching is bound to be the recombination lifetime of the electrons and holes injected into the active layer, so that the method has a shortcoming in that the switching time is limited.

There is also a Q switching method for modulation by Q switching and a mode locking method for generating a series of light pulses by producing a special operational mode in which the phase relationship among resonant modes is fixed. However, the Q switching method and the mode locking method have shortcomings in that they are complicated and equipment for these methods is difficult to make and costly. The Q switching method requires a light modulator in a resonator, and the mode locking method requires a resonator of complicated structure which is to be mounted on the outside.

To overcome such shortcomings of the conventional methods for modulation of radiated output from a light emitting semiconductor device, the inventors disclosed a light emitting semiconductor device of voltage control type in their Japanese Patent Laid-open Publication No. 60-1,874(1985). FIG. 6 is a schematic illustration of the essential portion of such a light emitting semiconductor device of the voltage control type which the inventor proposed previously. An active layer 1 has insulation claddings 2 and 3 formed on the top and bottom surfaces thereof respectively. A first control electrode 4 is attached to the insulation cladding 2, while a second control electrode 5 is attached to the other insulation cladding 3. A p-type injection region 6 and an n-type injection region 7 are attached to opposite sidewalls of the active layer 1. The p-type injection region 6 injects holes into the active layer 1, while the n-type injection region 7 injects electrons into the active layer 1. The injected electrons and holes recombine within active layer 1 and emit light therein.

When a positive control pulse voltage and a negative control pulse voltage as shown in FIG. 7A are applied to the first and second control electrodes 4 and 5 respectively, the injected electrons in the active layer 1 are captured in the active layer 1 on the side of the first control electrode 4, while the injected holes are also captured therein on the side of the second control electrode 5. Thus, a kind of polarization occurs. If the forbidden gap of the active layer 1 is selected to be smaller than the forbidden gaps of the insulation claddings 2 and 3, the injected electrons and holes are prevented from being extracted to the insulation claddings 2 and 3 by the electric field there. Accordingly, very quick modulation of the radiated output is made possible, without being restricted by their recombination lifetime, by using the control pulse voltage applied to the first and second control electrodes 4 and 5 as modulating signals.

The above light emitting semiconductor device of voltage control type, which was previously proposed by the inventors, has an outstanding merit in that its modulating speed of the radiated output is not restricted by the recombination life time of the injected electrons and holes, but it has the following limitations. The p-type injection region 6 and the n-type injection region 7 maintain their constant-rate injection of holes and electrons even when the control pulse voltages are applied (non-emitting periods), and the number of the electrons and holes increases gradually. Accordingly, an undesirable increase of the amount of light emission occurs and the light emission gradually increases with a time lapse even during the non-emitting period in response to the increase of the amount of the captured electrons and holes, as shown in FIG. 7B. With the constant-rate injection, the number of carriers in the active layer 1 gradually decreases during the emitting period, resulting in a gradual reduction of the radiated output in the emitting period.

In short, with the above light emitting semi-conductor device of the voltage control type, as long as the injection rate of the electrons and holes is constant, the steady state amount of radiated light settles at a certain level both in the emitting period and in the non-emitting period, which certain level depends on the constant injection rate. Accordingly, the amount of the radiated light in the steady state becomes constant regardless of the bias voltages at the control electrodes 4 and 5 of FIG. 6. Besides, if modulating pulse voltages with a short pulse duration are applied successively, the amount of the electrons and holes in the active layer decreases gradually, resulting in a gradual reduction of the level of the radiated output. Further, the injection efficiency of the arrangement of FIG. 6, i.e., the injection of electrons and holes from opposite sides of the active layer, is rather low.

SUMMARY OF THE INVENTION

Therefore, an object of the present invention is to solve the above-mentioned shortcomings and limitations of the prior art by providing an improved light emitting semiconductor device. With the semiconductor device of the invention, fluctuation of the radiated output after a switching operation is substantially eliminated, high-speed modulation is possible by a simple arrangement, and the amount of the radiated output during the non-emitting period is suppressed to a very low level.

An embodiment of the light emitting semi-conductor device of the invention has a base region, which is the active region of the device, i.e., the light emitting region, and is sandwiched by an emitter region and a collector region. The conduction type of the base region is opposite to that of the emitter and collector regions; for instance, the base region is n-type and the emitter and collector region are p-type. The emitter region has an emitter electrode attached thereto, the base region has a base electrode attached thereto, and the collector region has a collector electrode attached thereto. An injecting voltage source is connected across the emitter electrode and the base electrode so as to apply a constant voltage between the emitter region and the base region. Separately, a control voltage source is connected across the emitter electrode and the collector electrode so as to selectively apply a reverse bias to a base-collector junction at the collector side of the base region for controlling recombination of the injected carriers therein.

The control voltage source produces such non-emitting period voltage and emitting period voltage that carriers injected during the non-emitting period voltage are captured in the base region while the carriers thus captured are allowed to recombine during the emitting period voltage.

In a preferred embodiment of the invention, the base region is a 100 to 3,000 Å thick film and forbidden gap of the base region is smaller than those of the emitter region and the collector region by a difference of not less than 0.3 eV.

In another embodiment of the invention, the base region consists of multi-layers with different forbidden gaps.

The base region may be of n-type GaAs, the emitter region may be of p-type $Ga_{1-x}Al_xAs$ (x being 0.45–1.0), and the collector region may be of p-type $Ga_{1-y}Al_yAs$ (y being 0.6 to 1.0).

BRIEF DESCRIPTION OF THE DRAWINGS

For a better understanding of the invention, reference is made to the accompanying drawings, in which:

FIG. 1A is a schematic diagram showing the essential structure of a light emitting semiconductor device according to the invention;

FIG. 1B shows curves which illustrate the operating principle of the light emitting semiconductor device of FIG. 1A;

FIGS. 2A and 2B are graphs showing the relationship between control signals and the amount of radiated light;

FIG. 3 is a schematic perspective view showing a first embodiment of the light emitting semiconductor device of the invention;

FIG. 4 is a schematic sectional view showing a second embodiment of the light emitting semiconductor device of the invention;

FIG. 5 is a schematic sectional view showing a third embodiment of the light emitting semiconductor device of the invention;

FIG. 6 is a schematic diagram showing the essential structure of a light emitting semiconductor of prior art; and FIGS. 7A and 7B are graphs showing the relationship between control signals and the amount of radiated light in the conventional light emitting semiconductor device of FIG. 6.

Throughout different views of the drawings, the following symbols are used.
1: an active layer,
2, 3: insulation claddings,
4: a first control electrode,
5: a second control electrode,
6: a p-type injection region,
7: an n-type injection region,
10, 22, 30, 40: base regions,
11, 21: emitter regions,
12, 23: collector regions,
13, 27: base electrodes,
14, 28: emitter electrode,
15, 25: collector electrodes,
16: an injection power source,
17: a control power source,
20: a substrate,
24, 41: a GaAs layer,
26: an injection region,
31: a first base-layer,
32: a second base-layer,
33: a third base-layer,
42: a GaAlAs barrier layer.

DESCRIPTION OF THE PREFERRED EMBODIMENT

FIG. 1A and FIG. 1B show principles of the light emitting semiconductor device according to the invention by referring to an example. The invention is not restricted by this example. An n-type base region 10, which is the active region of the device, i.e., the light emitting region, is sandwiched by a p-type emitter region 11 and a p-type collector region 12, so as to form double hetero junctions. The forbidden gaps of the emitter region 11 and the collector region 12 are larger than that of the base region 10 by a difference which is preferably not smaller than 0.3 eV. A base electrode 13 is attached to one side of the base region 10, an emitter electrode 14 is attached to the emitter region 11 and a collector elector 15 is attached to the collector region 12.

To provide for injection of carriers, an injection power source 16 is connected across the base electrode 13 and the emitter electrode 14 so as to apply continuously a constant voltage therebetween. The base electrode 13 is kept negative with respect to the emitter electrode 14. Further, a control power source 17 is connected across the emitter electrode 14 and the collector electorde 15, so as to apply a reverse bias across a base-collector junction at the collector side of the base region 10. The control power source 17 is to control the recombination of electrons and holes which are injected into the base region 10.

When an injection voltage is applied between the base region 10 and the emitter region 11 from the injection power source 16, holes are injected into the base region 10 from the emitter region 11 while electrons are injected into the base region 10 from the base electrode 13. If no bias is applied across the emitter region 11 and collector region 12, the electrons in the base region 10 occupy the same space as that of the holes from the emitter region 11, and the electrons and holes are recombined and emit light as in the case of a regular light emitting semiconductor device. On the other hand, when a control voltage from the control voltage source 17 is applied across the emitter region 11 and the collector region 12, a strong reverse bias is produced across a p-n junction between the p-type collector region 12 and the n-type base region 10 as shown in FIG. 1B, and a depletion layer extends into the base region 10 for producing a potential gradient affecting the electrons and holes.

If the difference between the forbidden gap of the base region 10 and each of the forbidden gaps of the emitter region 11 and the collector region 12 is sufficiently large, the electrons and holes injected into the base region 10 are prevented from being extracted to the emitter region 11 and the collector region 12. Thus, if the forbidden gaps of the regions 10, 11, and 12 are properly selected and if the potential gradient of FIG. 1B is produced in the base region 10, the electrons A and holes B injected into the base region 10 are captured and the electrons A are spatially separated from the holes B. Accordingly, radiation can be turned on and off by switching the voltage from the control power source 17. It is noted that the potential gradient produced in the base region 10 causes a virtual decrease of the forbidden gap of the base region 10, so that the radiation wavelength and the gain factor for the light wave are shifted toward longer wavelengths.

FIG. 2A and FIG. 2B show the relationship between the control signals or modulating signals from the control power source 17 and radiation characteristics. When a modulating signal for a non-emitting period, as shown in FIG. 2A, is applied across the emitter region 11 and the collector region 12 as a control signal, the electrons and holes injected in the base region 10 are captured and polarized to the emitter side and the collector side respectively. In the non-emitting period, small amounts of electrons and holes are not captured and produce recombination radiation at a very low level. On the other hand, when the control voltage is switched to a zero level for an emitting period, the electrons and the holes are freed from the capture by the control electric field, and they recombine and cause recombination radiation. In this case, the electrons and holes which are captured during the non-emitting period start to recombine simultaneously with the switching of the modulating signal, so that light emission with a large radiated output starts immediately after the switching of the modulating signal.

Next, when the control voltage is switched to the bias level for the non-emitting period, the above potential gradient is produced in the base region 10 to capture the electrons and holes successively as they are injected therein from the injection power source. In this case, the direction of the hole injection coincides with the direction of the electric field of the control voltage.

Referring to FIG. 6, it is recalled here that, in the inventors' previous light emitting semiconductor device of voltage control type, electrons and holes are injected through sidewalls of the base region 1 at right angles to the direction of polarization of the captured electrons and holes. The electrons and holes are continuously injected regardless of the amount of the captured electrons and holes, so that with the increase of the amount of the captured electrons and holes, the amount of those electrons and holes which are not captured and available for recombination for radiation increases with lapse of time. Consequently, in the semiconductor device of FIG. 6, recombination radiation takes place in proportion to the rate of carrier injection. On the other hand, in the present invention the direction of hole injection coincides with the direction of the control electric field, so that with the progress of the polarization of electrons and holes, resistance of the base region increases to reduce the rate of hole injection thereto.

Thus, in the device of the invention, even if a constant voltage from the injection power source 16 is continuously applied, with the progress of the polarization of the carriers, the emitter-base current automatically decreases due to the above increase of the resistance. As a result, fluctuation of the radiated output after the switching of the control voltage can be minimized. Accordingly, the ratio of the amount of radiated light during the emitting period to that during the non-emitting period increases; in fact, the ratio under steady state can be made as high as ten.

The switching time of the light emitting semiconductor device of the invention is determined depending on the time for polarization of electrons and holes in the base region or on the time for return of the polarized state of electrons and holes to a homogeneously distributed state. When the thickness t of the base region 10 is less than 2,000 Å, the above time for polarization or the time for return is less than several picoseconds, so that modulation of output at a very high speed is possible. There is a preferable range of the thickness t of the base region 10. The electric field intensity in the base region 10 must be below an upper limit $E_m$ which depends on its insulation breakdown field. According to electromagnetic theory, when the electrons and holes are homogeneously distributed in the base region 10 with an electron volume density n and a hole volume density p under the absence of any electric field, in order to produce a sufficient polarization of such distributed electrons and holes in the base region 10, the following conditions must be satisfied.

$$t < (\epsilon E_m / en) \quad (1)$$

here, $\epsilon$ is the dielectric constant of the collector region 12, and e is the electric charge of an electron. It is generally believed that the necessary electron volume density n or the necessary hole volume density p for sufficiently large radiated output is more than about $1 \times 10^{17}/cm^3$. The upper limit $E_m$ of the electric field intensity of the collector region 12 made of, for instance, semiconductor of GaAlAs crystal system is about $5 \times 10^5$ V/cm, and its dielectric constant is about 10. Accordingly, if this collector region 12 is used, judging from the equation (1), the thickness t of the base region 10 must be less than about 3,000 Å. As to the minimum thickness t of the base region 10, the inventors carried out a number of experiments and found that the thickness t of more than about 100 Å is necessary to capture the injected holes from the emitter region 11 within the base region 10 without any leakage to the collector region 12.

Thus, the preferable range of the thickness t of the base region 10 is thicker than 100 Å but thinner than 3,000 Å. The inventors have also found that the preferable difference of the forbidden gap between the base region 10 and the emitter region 11 or between the base region 10 and the collector region 12 is more than 0.3 eV.

In the above description of the operating principle of the invention, a hetero bipolar transistor structure of p-n-p type has been referred to. However, the same operating characteristics can be also achieved by using a similar structure of n-p-n type provided that the polarities of various voltages applied to the electrodes are suitably modified. Furthermore, there is no restriction in the semiconductive material to form various regions of the light emitting semiconductor device of the invention. In fact, the semiconductor device of the invention can be made of III-V compound semiconductors, such as those of the GaAlAs group, the GsAlAsSb group, the GaAlAsP group, the GaAsP group, the InGaAsP group, and IV-VI compound semiconductors such as those of the PbSnTe group.

The invention will be explained in further detail now by referring to the following embodiments.

EMBODIMENT 1

FIG. 3 shows a schematic perspective view of a first embodiment. This first embodiment used GaAlAs group semiconductors. A p-type emitter region 21 of $Ga_{1-x}Al_xAs$ (for instance, x was 0.45 to 1.0) was formed on a p-type substrate 20 of GaAs. An n-type base region 22 acting as an active layer was formed on the emitter layer 21 by using n-type GaAs. A p-type collector region 23 was formed on the base region 22 by using p-type $Ga_{1-x}Al_xAs$ (for instance, x was 0.6 to 1.0). A GaAs layer 24, which was heavily doped with a p-type impurity, was formed on the collector region 23. A collector electrode 25 was attached to the top surface of the GaAs layer 24. Two injection regions 26 consisting of n-type $Ga_{1-y}Al_yAs$ were formed on opposite sidewalls of the base region 22, and base electrodes 27 were attached onto the injection regions 26 respectively. The injection regions 26 were to inject electrons into the base region 22. An emitter electrode 28 was attached to the bottom surface of the substrate 20.

Various regions of the semiconductor device can be made by growing the crystal through liquid phase epitaxy, molecular beam epitaxy, vapor phase epitaxy, or metal-organic chemical vapor deposition. The type of the carriers in each of the regions is not restricted as described above, but it may be reversed, and this note on the carrier type is also applicable to other ensuing embodiments.

To produce the light emitting semiconductor device of FIG. 3, the emitter region 21, the base region 22, and the collector region 23 were successively grown on the p-type GaAs substrate 20. As to the thickness of each layer, the emitter region 21 may be a 0.5–1.0 μm thick layer, the collector region 23 may be a 0.5–1.0 μm thick layer, and the base region 20 may be a 100 Å thick layer. In this case, to make the emitter region 21, the collector region 23 and the GaAs layer 24 p-type and to make the base region 20 n-type, magnesium (Mg) may be used as a p-type impurity and tin (Sn) may be used as an n-type impurity.

A photoresist stripe of for instance 2 μm width was formed on the top of the thus prepared GaAs layer 24 by the conventional photoresist process. The photoresist stripe acting as a mask, etching was effected so as to remove a part of the GaAs layer 24, the collector region 23, the base region 22, and the emitter region 21. The etching was ceased at an intermediate portion of the emitter region 21. Two injection regions 26 were made so as to sandwich the portions left after the etching, which injection regions 26 were formed by growth of crystal while doping with tin (Sn) as the n-type impurity thereof. In the final product, the surface of the GaAs layer 24 should be lower than the top surface of the collector region 23, but during the growth of the GaAs layer 24, the surface or the growing layer was allowed to be higher than the top of the collector region 23. The growth of the GaAs layer 24 may be stopped at a position below the top of the collector region 23. To facilitate the formation of electrodes in a later stage, it was preferable to grow the injection region 26 to a level flush with the top of the GaAs layer 24.

The collector electrode 25 acting as a control electrode consisting of an Au-Cr alloy film and the base electrodes 27 consisting of Au-Ge-Ni alloy films were deposited by using the photoresist process and vacuum evaporation method. If the growing surfaces of the injection regions 26 are above the top surface of the GaAs layer 24 at the end of the growth of the injection regions 26, it is possible to deposit Au-Cr alloy film of the collector electrode 25, or the control electrode, by the photoresist process and the vacuum evaporation method, and to use the thus deposited metallic electrode film as a mask so as to remove a part of the injection region 26, the GaAs layer 24, and the collector region 23 to an intermediate portion of the collector region 23 by etching while leaving the portion immediately below the electrode film, and to deposit Au-Ge-Ni alloy films of the base electrodes 27 by the photoresist process and the vacuum evaporation method. Finally, an Au-Cr alloy film was deposited on the bottom surface of the substrate 20 to form the emitter electrode 28.

To use the semiconductor device of the first embodiment as a semiconductor laser device, both ends of the stripe-like base layer are cleaved with a length of, for instance, 300 μm in such a manner that a pair of parallel cleavage planes are formed at right angles to the longitudinal direction of the stripe-like base layer. In this case, if the base region 22 has a sufficient amount of electrons and holes, e.g., at a density in excess of $1 \times 10^{18}$ cm$^{-3}$, amplification of light waves occur. Since the refractive index of the base region 22 is larger than the refractive indices of the emitter region 21, the collector region 23, and the injection regions 26, the light wave propagates while being confined in the base region and being fed back in the space between the pair of cleave planes. The pair of cleavage planes form two reflective surfaces of a resonator. One or both of the resonator surfaces may be formed by chemical etching.

It is apparent that, if such resonator surfaces are replaced with a suitable periodic structures, a distributed feedback type laser device or a distributed Bragg reflection feedback type laser device is formed. The above reference to the resonator surfaces and to the resonator of periodic structure are applicable to other embodiments to be described hereinafter.

An injection power source of about 1.5 V was connected across the base electrodes 27 and the emitter electrode 28 so as to make the base electrodes 27 negative relative to the emitter electrode 28. A control power source of 5 V was connected across the base electrodes 27 and the collector electrode 25 so as to make the collector electrode 25 negative relative to the base electrodes 27. The voltage from the control power source also acted as a modulation signal, and the collector electrode 25 also acted as a control electrode.

With the above arrangement, a net bias voltage of about 6.5 V was provided between the emitter region 21 and the collector region 23. This emitter-collector bias voltage ensured effective capture of the injected carriers in the base region 22 during the non-emitting period, and the recombination of the captured carriers was allowed in response to the switching of the control voltage or the modulation signal. As a result, the amount of light emission during the non-emitting period was suppressed to about one tenth of that during the light-emitting period, and the wavelength of the emitted light was controlled to about 100 Å, and the amplification gain factor for the light wave was controlled to about 50 cm$^{-1}$.

EMBODIMENT 2

FIG. 4 shows a schematic sectional view of a second embodiment of the light emitting semiconductor device of the invention. A base region 30 of the second embodiment consisted of three layers having different forbidden gaps. In FIG. 4, like parts to those of FIG. 3 are designated by like symbols. In the base region 30, a first base-layer 31 consisted of n-type $Ga_{1-x}Al_xAs$ (x was 0.15 to 0.3), a second base-layer 32 consisted of n-type $Ga_{1-y}Al_yAs$ (y was 0.0 to 0.15), and a third base-layer 33 consisted of n-type $Ga_{1-z}Al_zAs$ (z was 0.15 to 0.3). The overall thickness of the base region 30 was in a range of 100 to 3,000 Å, and the typical thicknesses of the first, second, and third base-layers 31, 32, and 33 were 200 Å, 100 Å, and 200 Å respectively. The forbidden gaps of both the first base-layer 31 contiguous to the emitter region 21 and the third base-layer 33 contiguous to the collector region 23 were set to be smaller than the forbidden gap of the second base-layer 32, so that the injected electrons and holes were effectively captured in the second base-layer 32. As a result, the light emission efficiency was improved and the resistance of the base region was produced.

EMBODIMENT 3

FIG. 5 shows a schematic sectional view of a third embodiment of the light emitting semiconductor device of the invention. A base region 40 of the third embodiment had multi-active layers. More particularly, the base region 40 included three GaAs layers 41 forming active layers, which GaAs layers 41 were mutually isolated by barrier layers 42 formed of n-type $Ga_{1-x}Al_xAs$ (x was 0.5 to 1.0). The injection region 26 of this third embodiment were formed by the thermal diffusion method or the ion implanation method.

In the third embodiment, the thickness of the barrier layer 42 between the active layers 41 was usually designed to be not thicker than the wavelength of electrons and holes wave function, which wavelength was about 100 Å, so that the electrons and holes could move through the active layers 41 due to the tunnel effects describable by the quantum theory. With such a multilayer structure of the base region, when the electrons and holes are polarized, spatial distances between electrons and hole were increased, and the controllability of the amount of radiated light, the wavelength of the emitted light, and the gain factor for the light wave was considerably improved.

In FIG. 5, only one example with three active layers 41 are shown for clarity, but the number of such active layers 41 can be selected from a range of 2 to 5.

With the special construction of the light emitting semiconductor device as described in detail in the foregoing, the invention achieves the following outstanding effects.

(1) Light emission with a high intensity is started simultaneously with the switching of control signal, because an injection power source allows continuous injection of carriers into the active layer and a control power source controls the recombination of the carriers in such a manner that a potential gradient produced by the control power source ensures both the effective capture of the injected carriers in the active layer during the non-emitting period and the recombination of the captured carriers during the emitting period. Thus, the duration of the modulating pulse can be reduced so as to increase the frequency of the modulating signal.

(2) One type carriers, e.g., electrons or holes, are injected in the same direction as the direction of the potential gradient generated by the control power source, so that the rate of the carrier injection into the active layer can be automatically regulated in response to the progress of the carrier polarization in the active layer. Accordingly, fluctuation in the radiated output after the switching of the control voltage can be minimized.

(3) One type carriers, e.g., electrons or holes, are injected in the same direction as the above-mentioned direction of the potential gradient, while the other type carriers are injected in a direction perpendicular to the potential gradient direction, so that the injection efficiency is improved.

(4) The control voltage is applied across the emitter electrode and the collector electrode acting as a control electrode, so that the formation of the electrodes is made easier.

Although the invention has been described with a certain degree of particularity, it is understood that the present disclosure has been made only by way of example and that numerous changes in details of construction and the combination and arrangement of parts may be resorted to without departing from the scope of the invention as hereinafter claimed.

What is claimed is:

1. A light emitting semiconductor device, comprising:
   an emitter region having an emitter electrode attached thereto;
   a base region which can be induced to emit light formed on one side of said emitter region, having a conduction type, and having a base electrode attached thereto;
   a collector region formed on another side of said base region opposite the emitter region and defining a base-collector junction between the base region and the collector region and having a collector electrode attached thereto, wherein the collector region and the emitter region have a conduction type which is opposite that of the base region;
   an injecting voltage source connected across the emitter electrode and the base electrode so as to apply a constant voltage between the emitter region and the base region so that carriers of one type are into the base region from the emitter region and carriers of another type are injected into the base region from the base electrode; and
   a control voltage source connected across the emitter electrode and the collector so as to selectively apply a reverse bias to the base-collector junction for controlling recombination of carriers injected to the base region, the control voltage source producing such non-emitting period voltage and emitting period voltage that carriers injected into the base region during the non-emitting period voltage are captured in the base region whereby they are prevented from recombining and emitting light, while the carriers captured in the base region and carriers injected into the base region during the emitting period voltage are allowed to recombine within the base region so as to emit light.

2. A light emitting semiconductor device as set forth in claim 1, wherein said base region is a film having a thickness ranging from 100 to 3,000 Å and has a forbidden gap which is smaller than those of the emitter region and the collector region by not less than 0.3 eV.

3. A light emitting semiconductor device as set forth in claim 1, wherein said base region consists of multilayers with different forbidden gaps.

4. A light emitting semiconductor device as set forth in claim 1, wherein said base region consists of n-type GaAs, said emitter region consists of p-type $Ga_{1-x}Al_xAs$ (x being 0.45 to 1.0), and said collector region consists of p-type $Ga_{1-y}Al_yAs$ (y being 0.6 to 1.0).

* * * * *

UNITED STATES PATENT AND TRADEMARK OFFICE
CERTIFICATE OF CORRECTION

PATENT NO. : 4,845,535

DATED : July 4th, 1989

INVENTOR(S) : Masamichi Yamanishi et al.

It is certified that error appears in the above-identified patent and that said Letters Patent is hereby corrected as shown below:

In the drawing, Figures 2A, 2B and 3 should appear as shown on the attached sheets.

Signed and Sealed this

Twenty-fourth Day of July, 1990

Attest:

HARRY F. MANBECK, JR.

*Attesting Officer*      *Commissioner of Patents and Trademarks*

UNITED STATES PATENT AND TRADEMARK OFFICE
CERTIFICATE OF CORRECTION

PATENT NO. : 4,845,535
DATED : July 4th, 1989
INVENTOR(S) : Masamichi Yamanishi et al.

It is certified that error appears in the above-identified patent and that said Letters Patent is hereby corrected as shown below:

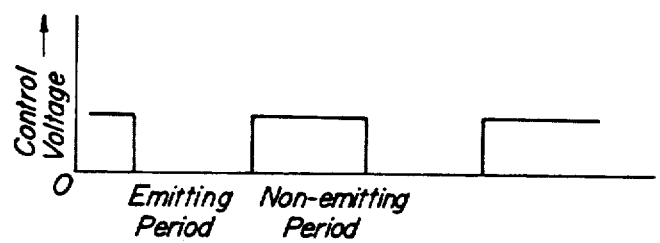

FIG.2A

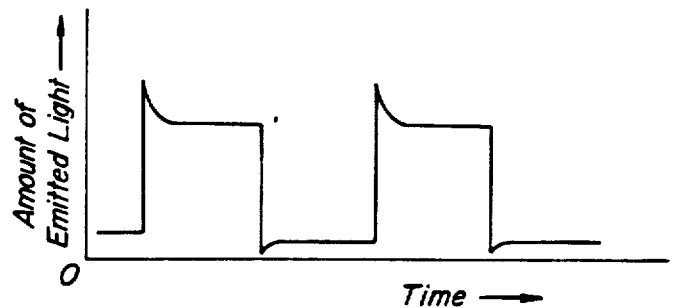

FIG.2B

UNITED STATES PATENT AND TRADEMARK OFFICE
CERTIFICATE OF CORRECTION

PATENT NO. : 4,845,535

DATED : July 4th, 1989

INVENTOR(S) : Masamichi Yamanishi et al.

It is certified that error appears in the above-identified patent and that said Letters Patent is hereby corrected as shown below:

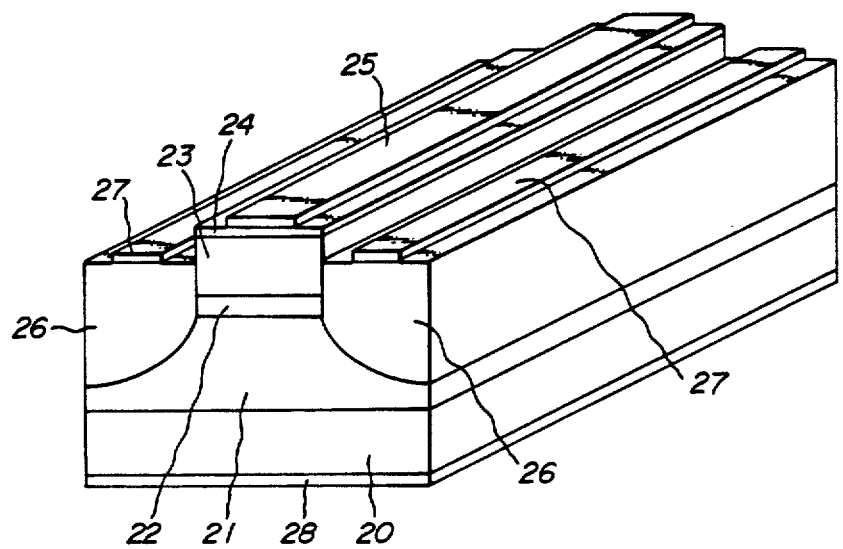

FIG. 3